United States Patent [19]
Babu et al.

[11] Patent Number: 4,599,134
[45] Date of Patent: Jul. 8, 1986

[54] PLASMA ETCHING WITH TRACER

[75] Inventors: Suryadevara V. Babu, Potsdam; Joseph G. Hoffarth; John A. Welsh, both of Binghamton, all of N.Y.

[73] Assignee: IBM Corporation, Armonk, N.Y.

[21] Appl. No.: 743,010

[22] Filed: Jun. 10, 1985

[51] Int. Cl.$^4$ .......................... B44C 1/22; C03C 15/00; C03C 25/06; B29C 17/08
[52] U.S. Cl. ........................................ 156/626; 134/1; 134/22.1; 156/643; 156/644; 156/645; 156/655; 156/64; 156/253; 156/272.6; 156/345; 156/902; 204/192 E
[58] Field of Search .................... 134/1, 22.1, 22.14; 29/852; 156/626, 627, 643, 644, 645, 646, 655, 668, 64, 253, 272.6, 345, 901, 902; 204/192 E, 298

[56] References Cited

U.S. PATENT DOCUMENTS 4,375,384  3/1983  Molina ............................... 156/626.
4,482,424  11/1984  Katzir et al. ....................... 156/626

FOREIGN PATENT DOCUMENTS 0155724  9/1983  Japan ................................. 156/626

OTHER PUBLICATIONS

IBM Technical Disclosure Bulletin, vol. 24, No. 11B, Apr. 1982, Plasma Etch Evaluation Indicators, Hall et al., pp. 5922–5923.

Primary Examiner—William A. Powell
Attorney, Agent, or Firm—Perman & Green

[57] ABSTRACT

A procedure for cleaning drilled holes in laminated workpieces such as printed electric circuit boards includes the steps of coating a cutting instrument, such as a drill bit, with a liquid tracer prior to a cutting or drilling operation. During the cutting or drilling operation, the liquid tracer becomes mixed with material such as an electrically insulating binder layer disposed between opposed metal plates of the circuit board. Any smearing of the insulation material upon exposed metal surfaces of the drilled hole contain elements of chemical compounds used in the tracer. After extraction of the drill bit from the circuit board, the board is placed in a plasma reactor wherein the metal surfaces are etched to remove any smears and debris of the insulation material found on the exposed metal surfaces. The tracer elements, such as deuterium and phosphorus are monitored in the effluent plasma of the reactor to determine when the cleaning of drilled holes in the board is completed.

12 Claims, 1 Drawing Figure

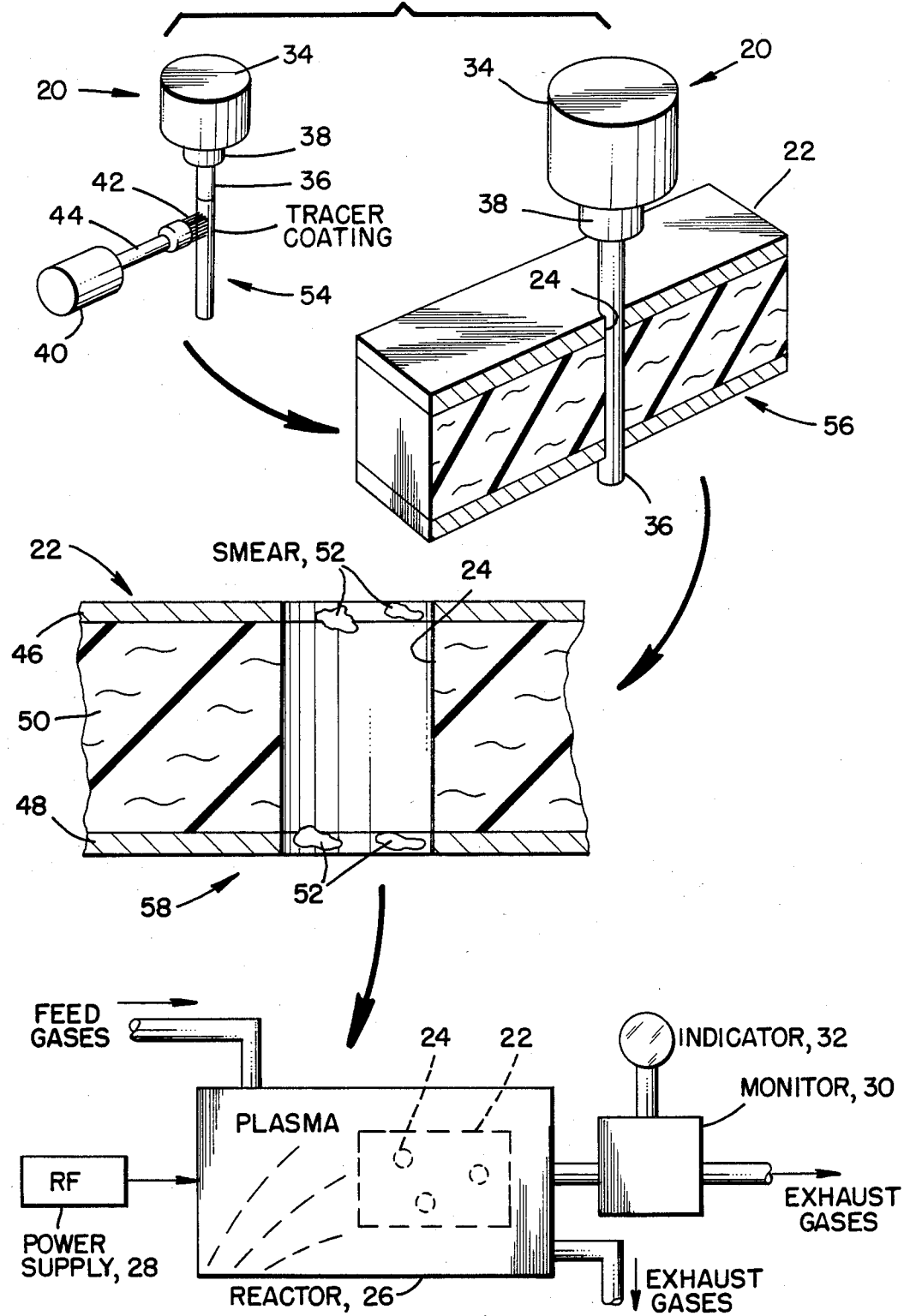

4,599,134

PLASMA ETCHING WITH TRACER

BACKGROUND OF THE INVENTION

This invention relates to plasma etching with a tracer and, more particularly, to a manufacturing process of shaping laminated workpieces with a cutting tool, such as the drilling of holes in electronic printed circuit boards for receipt of through-conductor pins, wherein any smearing of material of one lamina upon a second lamina at the interface with the cutting tool is cleaned by plasma etching with a tracer to indicate completion of the cleaning of the smear.

Manufacture of numerous objects involves the use of cutting tools in shaping a workpiece to produce an end product or a component of an end product. Generally, considerable heat is generated at the site of the cutting in the workpiece by the cutting tool. In some cases, the heat may have a deleterious effect on the material of the workpiece so as to render the workpiece unsuitable for its intended purpose.

One case of considerable interest is the manufacture of electronic printed circuit boards wherein through holes are to be drilled through the board for the passage of electrically conducting pins which are to connect electrically conducting metallic strips or lines on opposite sides of the board. Typically, a printed circuit board is fabricated as a laminated structure of metallic electrically conducting layers spaced apart by a layer of insulating material such as a mixture of fiber glass and epoxy resin. The insertion of the electrically conducting pin necessitates the drilling of a hole through two metallic layers and one insulating layer while maintaining a clean surface in the hole at each of the metallic layers so as to insure good electrical connection between the metallic layers and the pin.

A problem arises in that the heat developed by the cutting edge of a drill used in drilling the hole through the metallic layers and the insulating layer tends to melt the insulating material on to the surface of the hole at each of the metal layers. Since the insulating material is composed of the fiber glass and the resin, the melting results in a smearing of the resin on the metal surfaces with a subsequent loss of electrical conduction between the conducting pin and the metallic layers. The resulting circuit board, is therefore, defective.

SUMMARY OF THE INVENTION

The foregoing problem is overcome and other advantages are provided by a method of manufacture which, in accordance with the invention, includes plasma etching for cleaning a drill hole and the introduction of a tracer for monitoring the etching process to determine when the etching process and cleaning of the hole have been completed. The method accomplishes a major objective of the invention, namely, the detection of completion the clearing away of any smeared material from a cut produced by a cutting instrument such as a drill. The clearing prepares a workpiece for a further manufacturing step of connecting an electrically conducting element to the workpiece at the site of the cut.

The method of the invention is readily demonstrated for the important case of drilling a through hole in a printed circuit board for installation of a metallic pin which provides electrical connection between conductors on opposite sides of the board. The method begins with the coating of a drill bit with a tracer in the form of a thin layer of liquid which serves as a carrier of a tracer element or agent which can be readily detected in the plasma effluent from a plasma reactor. Detection of the tracer element can be accomplished by a mass spectrometer or by use of an optical emission technique.

The coated drill bit is then applied to the workpiece for drilling the hole. During the drilling process, the liquid comes in contact with the insulation material, namely, the layer of fiber glass and epoxy resin between the metallic layers. The liquid with the tracer element therein are adsorbed into the insulation material, and are present in any smear of the insulation material which may develop upon the metallic layer surfaces in the drilled hole. Even if the heat developed by the drilling operation causes some decomposition in the insulation material and in the tracer, the tracer element is still present in the smear.

The drill bit is then withdrawn from the workpiece, and the workpiece is placed within a plasma reactor for treatment by a plasma etchant. The etchant etches the epoxy resin on the metal surfaces in the hole and thereby removes the smear. The meterial of the smear, including the tracer entrained therein, appear in the exhaust products of the plasma. The plasma effluent is monitored for the presence of the tracer element. The concentration of the tracer element in the plasma drops as the smear is removed. When the concentration of the tracer element drops below a predetermined reference value, the cleaning of the smear from the hole is completed.

BRIEF DESCRIPTION OF THE DRAWING

The foregoing aspects and other feature of the invention are explained in the following description taken in connection with the accompanying drawing wherein the sole FIGURE shows a diagrammatic presentation of the method steps of the invention.

DETAILED DESCRIPTION

With reference to the drawing, the method of the invention is described in terms of a preferred embodiment direction to the drilling of through hole in the fabrication of a printed circuit board. It is to be understood that the invention is applicable also to the cleaning of residues from machining operations involving cutting tools other than drills, and involving workpieces other than circuit boards.

The FIGURE shows a procedure wherein a drill 20 is applied to a workpiece shown as a printed circuit board 22 for drilling a hole 24 therein. Thereafter, the drill is retracted from the board 22, and the board 22 is placed in a reactor 26 for treatment by an etchant in a plasma generated within the reactor 26 by use of a well-known RF (radio frequency) source 28, and feed gases applied to the reactor 26. The feed gases continuously flows through the reactor 26, and the products plus any unreacted etchant exit via a monitor 30 which monitors the concentration of a tracer, or a component of the tracer, so as to determine when the etching procedure should be terminated. The monitor 30 is provided with an indicator 32 which provides an indication to personnel utilizing the reactor 26 to terminate the etching process. Alternatively, the monitor 30 can be connected directly to a valve (not shown) at an output port of the source 28 for automatically extinguishing the plasma in the reactor 26.

The drill 20 comprises a motor 34, a bit 36 and a chock 38 for securing the bit 36 to the motor 34. There is also provided a container 40 holding a tracer in the form of a liquid which is dispensed via a brush 42 connected via a tube 44 to an outlet of the container 40.

The printed circuit board 22 is formed as a laminated structure comprising an upper metallic layer 46 and a lower metallic layer 48 which are disposed on opposite sides of a central layer 50 of electrical insulation material. The insulation material is composed of fiberglass bonded together by an epoxy resin. During the process of drilling the hole 24 in the board 22, heat may be produced to such an extent that the resin may melt and be carried by the bit 36 about the surface of the hole 24 to produce smears 52 of the insulation, or other such debris along the surfaces of the metallic layers 46 and 48 at the top and bottom portions of the hole 24. Such smears 52 interfere with the electrical connections between the metallic layers 46 and 48 and an electrically conducting pin (not shown) which is to be inserted into the hole 24 to provide electrical connection between the upper and lower layers 46 and 48. The pin may be constructed as a separate mechanical element which is inserted into the board 22 by being passed through the hole 24, or may be formed by dipping the board 22 into a solder bath (not shown) such that the liquid solder advances through the hole 24 to connect the upper layer 46 and the lower layer 48. In the event that a smear or debris completely covers the surface of a layer 46 or 48 at the hole 24, then no electrical connection is provided between the layers 46 and 48 by the foregoing pin. Thus, an important step in the manufacturing procedure is the cleaning of the smears 52 by the process of plasma etching in the reactor 26, and the use of a tracer, in accordance with the invention, for determining when the cleaning of the smear has been completed.

In accordance with the invention, the method begins with the coating of a tracer on the bit 36. The tracer comprises a substance which is either in liquid form, or is carried by a liquid as in a solution or a suspension. In particular, the tracer comprises an element which is completely absent from any of the constituents in the board and is readily detected by a mass spectrometer, or the tracer may be an element which readily forms a compound which is observable by a mass spectrometer. Alternatively, detection equipment employing an optical emission technique may be used in detecting the tracer by responding to either an element or compound of the tracer.

The coating of the tracer upon the bit 36 is shown by way of a stylized view at 54 wherein the tracer is stored in liquid form in the container 40. The tracer exits the container 40 via the tube 44 and is applied by the brush 42 to the bit 36, as the bit 36 is slowly rotated by the motor 34. The method then proceeds to the next step wherein the drill 20 is applied to the board 22 as is shown at 56 in the sectional view of the board 22. In the view at 56, the board 22 is sectioned through the hole 24 to demonstrate the process whereby rotation and advancement of the drill bit 36 shifts the liquid tracer from the bit 36 to the sides of the hole 24 being drilled. The tracer coating on the bit 36 is relatively thin, on the order of microns in thickness. Such a small quantity of the tracer is readily adsorbed by the insulation material of the layer 50 during the drilling process.

The heat generated during the drilling may cause changes in the chemical composition of the insulation and the tracer including decomposition of a compound present in the tracer. However, since the detection is based on the presence of a specific element, or compound resulting from the decomposition, the detection of the presence of the tracer can proceed even in the presence of such changes in the composition of the insulation and of the tracer substance. In particular, it is noted that the intermixing of the tracer substance with the insulation material insures that some of the tracer will be present in any smear resulting from the drilling process.

After drilling the hole 24, the drill 20 is retracted from the board 22 leaving the hole 24 with possible smears 52 as depicted at 58. The view at 58 is a vertical section of the board 22 taken through the hole 24. While the smears 52, as shown at 58, are depicted as occluding only a portion of the metallic surfaces of the hole 24, it is to be understood that such smears or debris from the drilling operation may not be present at all in some cases, or may completely occlude the surfaces in other cases, such occlusion occurring on a statistical basis, and being dependent also on the drilling speed of the drill 20. The amount of etching of the metallic surfaces by the plasma etchant varies with the extent of the smearing. Thus, in a typical circuit board 22 having several or more through holes such as the hole 24, the amount of etching required to completely clear away the smears and debris is determined, in accordance with the invention, by monitoring the amount of tracer present in the material of the smears 52 as this material is lifted away from the metallic surfaces by the plasma.

The next step in the method is the emplacement of the board 22 in the reactor 26. A continuous flow of the etchant is initiated through the reactor 26 wherein the plasma generated by use of the RF source 28 causes reactions that remove the smear from the metal surfaces in the board 22. The resulting exhaust products of the reaction and unreacted etchant exit the reactor 26 with a portion of the exhaust products exiting via the monitor 30. The monitor 30 activates the indicator 32 when the concentration of the tracer drops sufficiently low to indicate that no more material of the smears 52 is being carried off by the plasma. At this point, the cleaning of the smears is completed, the RF generator of the source 28 is operated to shut down the plasma into the reactor 26, and the board 22 is removed from the reactor 26 for further steps in the construction of a printed circuit.

The tracer should contain elements which are not found in the materials from which the circuit board 22 is constructed, so as to provide unambiguous detection of a tracer element among other elements of the materials of the board 22 which may be present in the exhaust products of the plasma. Suitable tracer substances are, but not limited to, deuterated compounds such as cyclohexane-$d_{12}$ and fluorobenzene-$d_5$ which contain a relatively large number of deuterium atoms per mole, and molecules containing phosphorus such as dimethyl methyl phosphonate, dimethyl phosphite, tetramethyl ammonium hexafluoro phosphate (a solid), and trimethyl phosphenoacetate. Substances containing heavy elements such as iodine, bromine, chromium, rare earths, antimony, barium, vanadium and cobalt, by way of example, which are not present in the circuit board may also be used. During use of the deuterated compounds, the monitor 30 is operated to detect the presence of deuterium fluoride or deuterium oxide in the mass spectrum. Upon the use of molecules containing phosphorus in the tracer, the monitor 30 is operated to detect an oxide of phosphorus ($P_2O_5$). The foregoing compounds of deuterium and phosphorus are present in the exhaust plasma gases independently of whether or not there is decomposition in the insulation material of the layer 50 due to heat of the drilling operation. If desired, the monitor 30 may include a detector of compounds of the tracer elements.

In view of the continuous flow of fresh etchant through the reactor 26, the concentration of the tracer in the exhaust gas from the reactor remains relatively constant and drops precipitously upon the conclusion of the cleaning operation. Accordingly, the monitor 30 can be set to respond to a near zero concentration of a tracer element such as deuterium or phosphorus.

The foregoing embodiments of the invention can be readily implemented either manually or automatically in a process for manufacturing printed circuit boards. The chemicals and equipment utilized in performing the method of the invention are readily obtainable.

It is to be understood that the above described embodiment of the invention is illustrative only, and that modifications thereof may occur to those skilled in the art. Accordingly, this invention is not to be regarded as limited to the embodiment disclosed herein, but is to be limited only as defined by the appended claims.

We claim:

1. A method for shaping a workpiece comprising:
    coating a cutting instrument with a tracer;
    advancing said instrument toward the workpiece to form a cut therein, said tracer adhering to a surface of said cut;
    withdrawing said instrument from said cut;
    applying an etchant in the form of a plasma to the workpiece for etching away debris on the surface of the cut, the plasma lifting away the tracer, said applying including a continuous replenishment of fresh plasma;
    monitoring the plasma for the presence of a component of the tracer; and
    terminating the application of the plasma to the workpiece when the monitoring shows the plasma to be substantially free of the tracer.

2. A method according to claim 1 wherein said shaping of the workpiece comprises a drilling of a hole in the workpiece, and wherein said cutting instrument is a drill bit.

3. A method according to claim 1 wherein said coating is accomplished by dispensing a liquid carrier of the tracer upon a cutting edge and a neighboring surface of the cutting instrument.

4. A method according to claim 1 wherein said workpiece is a laminate of layers of solid material interspersed with a layer of a softer binder material which holds the solid layers in their respective positions, and wherein said coating is accomplished by dispensing the tracer in a liquid upon the cutting edge and neighboring surface of the cutting instrument, the liquid with the tracer adsorbing into the softer material resulting in the presence of the tracer in said debris, said debris comprising a smear of the softer material, upon the solid material.

5. A method according to claim 4 wherein said tracer comprises a class of readily detectable substances including deuterated compounds, molecules containing phosphorus and oxygen, and heavy elements not present in said workpiece.

6. A method according to claim 5 wherein said deuterated compounds include cyclohexane-$d_{12}$, fluorobenzene-$d_5$, wherein said molecules containing phosphorus and oxygen include dimethyl methyl phosphonate, dimethyl phosphite, tetramethyl ammonium hexafluorophosphate, and trimethyl phosphenoacetate, and wherein said heavy elements include iodine, bromine, chromium and cobalt.

7. A method of drilling a hole in a workpiece comprising a laminated structure with layers of metal and electrical insulation, the workpiece being a part of an electrical circuit assembly with connections to be made between the metal layers via an insulating layer disposed between the metal layers, the method comprising the steps of:
    coating a drill bit with a layer of tracer material which adsorbs into the insulation:
    advancing the drill into the workpiece to drill a hole therein to allow passage of an electrically conductive element via said insulation for connection with said metal layers, the drilling of the hole inducing said insulation to smear over a surface of said hole under influence of heat developed by a drilling process, such smearing occluding a surface of the metallic layer and inhibiting electrical contact therewith, said tracer material adsorbing into said insulation during the drilling;
    withdrawing the drill bit from the hole;
    applying an etchant in the form of a plasma to the workpiece for etching away a smear from a metallic surface at the hole, the plasma lifting away the tracer material;
    monitoring the concentration of a component of the tracer material within the plasma; and
    terminating the application of the plasma to the workpiece when the magnitude of the concentration shows that no further tracer material is being evolved during the etching.

8. A method according to claim 7 wherein said step of applying includes a continuous replenishment of fresh etchant in the plasma, and wherein said step of terminating occurs when the monitoring shows the plasma to be substantially free of the tracer material.

9. A method according to claim 8 wherein said tracer material comprises a class of readily detectable substances including deuterated compounds, heavy elements and molecules containing phosphorus and oxygen.

10. A method according to claim 9 wherein said deuterated compounds include cyclohexane-$d_{12}$, fluorobenzene-$d_5$, and wherein said molecules containing phosphorus and oxygen include dimethyl methyl phosphonate, dimethyl phosphite, tetramethyl ammonium hexafluoro phosphate, and trimethyl phosphenoacetate, and wherein said heavy elements include iodine, bromine, chromium, rare earths, antimony, barium, vanadium and cobalt.

11. A method for shaping a workpiece comprising:
    coating a cutting instrument with a tracer;
    advancing said instrument toward the workpiece to form a cut therein, said tracer adhering to a surface of said cut;
    withdrawing said instrument from said cut;
    applying an etchant in the form of a plasma generated reactive radicals to the workpiece for etching away debris on the surface of the cut, the plasma processing and lifting away the tracer;
    monitoring the concentration of a component of the tracer within the plasma; and
    terminating the application of the plasma to the workpiece when the magnitude of the concentration shows that no further tracer is being evolved during the etching.

12. A method according to claim 11 wherein said step of applying included a continuous replenishment of fresh reactant in the plasma, and wherein said step of terminating occurs when the monitoring shows the plasma to be substantially free of the tracer material.

* * * * *